US011690267B2

(12) United States Patent
Jia

(10) Patent No.: US 11,690,267 B2
(45) Date of Patent: Jun. 27, 2023

(54) DEFINING SOLUTION, DISPLAY PANEL, DISPLAY APPARATUS, AND METHOD OF PREPARING PIXEL DEFINING LAYER

(71) Applicants: HEFEI BOE JOINT TECHNOLOGY CO., LTD., Anhui (CN); BOE TECHNOLOGY GROUP CO., LTD., Beijing (CN)

(72) Inventor: Wenbin Jia, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 184 days.

(21) Appl. No.: 17/251,837

(22) PCT Filed: May 13, 2020

(86) PCT No.: PCT/CN2020/090103
§ 371 (c)(1),
(2) Date: Dec. 14, 2020

(87) PCT Pub. No.: WO2020/233479
PCT Pub. Date: Nov. 26, 2020

(65) Prior Publication Data
US 2021/0257442 A1    Aug. 19, 2021

(30) Foreign Application Priority Data

May 17, 2019   (CN) .......................... 201910413194.0

(51) Int. Cl.
*H01L 27/32*   (2006.01)
*H10K 59/173*   (2023.01)
(Continued)

(52) U.S. Cl.
CPC ......... *H10K 59/173* (2023.02); *H10K 59/122* (2023.02); *H10K 71/00* (2023.02); *H10K 59/1201* (2023.02)

(58) Field of Classification Search
CPC . H01L 27/3283; H01L 27/3246; H01L 51/05; H01L 2227/323
(Continued)

(56) References Cited

U.S. PATENT DOCUMENTS

2014/0131743 A1   5/2014 Jiang et al.
2014/0329056 A1   11/2014 Hou et al.
(Continued)

FOREIGN PATENT DOCUMENTS

CN   103227190 A   7/2013
CN   105759568 A   7/2016
(Continued)

OTHER PUBLICATIONS

English Machine Translation of CN 106941112 (Year: 2017).*
English Machine Translation of CN 108899345 (Year: 2018).*

*Primary Examiner* — Dzung Tran
(74) *Attorney, Agent, or Firm* — The Webb Law Firm

(57) ABSTRACT

The present disclosure provides a defining solution for preparing a pixel defining layer configured to define individual pixels on a substrate, comprising: a lyophilic material, a lyophobic material and an initiator, wherein the lyophobic material comprises: a first lyophobic material and a second lyophobic material, and wherein a mass average molecular weight of the first lyophobic material is greater than a mass average molecular weight of the second lyophobic material, and a mass average molecular weight of the lyophilic material is greater than the mass average molecular weight of the first lyophobic material. The present disclosure
(Continued)

further provides a display panel, a display apparatus and a method of preparing a pixel defining layer.

14 Claims, 3 Drawing Sheets

(51) Int. Cl.
*H10K 59/122* (2023.01)
*H10K 71/00* (2023.01)
*H10K 59/12* (2023.01)

(58) Field of Classification Search
USPC .......................................................... 257/40
See application file for complete search history.

(56) References Cited

U.S. PATENT DOCUMENTS

| | | | |
|---|---|---|---|
| 2016/0056218 A1* | 2/2016 | Wang | H01L 27/3246 438/34 |
| 2016/0195810 A1 | 7/2016 | Shim et al. | |
| 2016/0284776 A1 | 9/2016 | Kim | |
| 2019/0096970 A1* | 3/2019 | Hou | H01L 51/0005 |
| 2019/0305058 A1* | 10/2019 | Hou | H01L 51/56 |
| 2019/0305059 A1* | 10/2019 | Hou | H01L 27/3246 |
| 2020/0056033 A1 | 2/2020 | Li et al. | |
| 2020/0295101 A1 | 9/2020 | Song | |

FOREIGN PATENT DOCUMENTS

| | | |
|---|---|---|
| CN | 106941112 A | 7/2017 |
| CN | 108899345 A | 11/2018 |
| CN | 108987449 A | 12/2018 |
| CN | 109103221 A | 12/2018 |
| CN | 110098352 A | 8/2019 |

* cited by examiner

DEFINING SOLUTION, DISPLAY PANEL, DISPLAY APPARATUS, AND METHOD OF PREPARING PIXEL DEFINING LAYER

CROSS-REFERENCE TO RELATED APPLICATIONS

This application is a U.S. National Stage under 35 U.S.C. § 371 of International Application No. PCT/CN2020/090103, as filed on May 13, 2020, which claims the priority to the Chinese Patent Application No. 201910413194.0 which was filed on May 17, 2019 and entitled "DEFINING SOLUTION, DISPLAY PANEL, DISPLAY APPARATUS AND METHOD OF PREPARING PIXEL DEFINING LAYER". The disclosure of each of these applications is incorporated hereby as a whole into the present disclosure.

TECHNICAL FIELD

The present application relates to a field of display technology, and particularly to a defining solution, a display panel, a display apparatus and a method of preparing a pixel defining layer.

BACKGROUND

With the development of display technologies, OLED (Organic Light-Emitting Diode) gradually shows great application potential in the display field by virtue of its advantages of self-luminescence, fast response, wide viewing angle, bright color, lightness and thinness, etc., and has received strong attention from academic and industrial circles.

The inkjet printing process based on the OLED display technology requires that a pixel defining layer is fabricated on an electrode of a substrate in advance to limit ink droplets to accurately flow into a designated sub-pixel area, and the ink droplets need to be sufficiently spread in the sub-pixel area and do not overflow. The current pixel defining layer generally adopts the following two structures: a single-layer structure and a double-layer structure.

For the pixel defining layer with a double-layer structure, it adopts a bifunctional material with smaller top surface energy and greater bottom surface energy, thereby the smaller top material surface energy makes the top layer lyophobic to make sure that the ink droplets will not overflow, and the greater bottom material surface energy makes the bottom lyophilic to a certain extent to make sure that the ink droplets spread completely in the sub-pixel area, in order to avoid a pinhole leakage phenomenon caused by the ink droplets spreading incompletely in the sub-pixel area. However, the current pixel defining layer with a double-layer structure is complicated in technology, needs the use of two kinds of different fabrication technologies, and need two sets of mask plates, which is high in fabrication cost and processing risk.

For the pixel defining layer with a single-layer structure, the current single-layer material generally can only be that a very thin layer of the top surface is lyophobic, whereas most of the thickness of the lower part is lyophilic. Both sides of the pixel defining layer have a strong affinity for ink, such that the ink droplets will climb along the lyophilic layer to the lyophobic layer in the drying process to form an uneven film 1 that is thick on edges and thin in the middle, as shown in FIG. 1. Such an uneven film easily causes uneven luminescence within the device pixel, and thereby influences the service life of the device.

SUMMARY

In a first aspect, embodiments of the present disclosure provides a defining solution for preparing a pixel defining layer configured to define individual pixels on a substrate, comprising: a lyophilic material, a lyophobic material and an initiator, wherein the lyophobic material comprises: a first lyophobic material and a second lyophobic material, and wherein amass average molecular weight of the first lyophobic material is greater than a mass average molecular weight of the second lyophobic material, and amass average molecular weight of the lyophilic material is greater than the mass average molecular weight of the first lyophobic material.

Optionally, a chain average fluorine content of the first lyophobic material is less than a chain average fluorine content of the second lyophobic material, and the lyophilic material does not contain fluorine.

Optionally, a mass ratio of the first lyophobic material is 2%-20% of the defining solution, amass ratio of the second lyophobic material is 20%-50% of the defining solution, and a mass ratio of the lyophilic material is 30%-76% of the defining solution.

In a second aspect, the embodiments of the present application provide a display panel, comprising a substrate, and a pixel defining layer located on one side of the substrate and configured to define individual pixels on the substrate, wherein the pixel defining layer comprises: a first hydrophilic layer, a first lyophobic layer, and a second lyophobic layer;

the first lyophilic layer is located on the one side of the substrate;

the first lyophobic layer is located on one side of the first hydrophilic layer away from the substrate; and the second lyophobic layer is located on one side of the first lyophobic layer away from the substrate, wherein a mass average molecular weight of the first lyophobic layer is greater than a mass average molecular weight of the second lyophobic layer, and a mass average molecular weight of the first hydrophilic layer is greater than the mass average molecular weight of the first lyophobic layer.

Optionally, the first lyophobic layer is in direct contact with the second lyophobic layer.

Optionally, the display panel further comprises: a second lyophilic layer disposed between the first lyophobic layer and the second lyophobic layer, wherein a mass average molecular weight of the second lyophilic layer is greater than the mass average molecular weight of the second lyophobic layer and less than the mass average molecular weight of the first lyophobic layer.

Optionally, a chain average fluorine content of the first lyophobic layer is less than a chain average fluorine content of the second lyophobic layer, and the first lyophilic layer does not contain fluorine.

Optionally, the chain average fluorine content of the first lyophobic layer is 30% to 80% of the chain average fluorine content of the second lyophobic layer.

Optionally, a mass ratio of the first lyophobic layer to the second lyophobic layer is 10% to 40%.

Optionally, the first lyophobic layer comprises hydroxyl functional groups.

Optionally, a material of the first lyophobic layer is Polyimide (Pi) or polyethylene terephthalate (PET) containing fluorine, a material of the second lyophobic layer is polyimide or polyethylene terephthalate containing fluorine, and a material of the first lyophilic layer is polyimide or polyethylene terephthalate not containing fluorine.

Optionally, a material of the first lyophobic layer is polyimide or polyethylene terephthalate containing fluorine, a material of the second lyophobic layer is polyimide or polyethylene terephthalate containing fluorine, a material of the first lyophilic layer is polyimide or polyethylene terephthalate not containing fluorine, and a material of the second lyophilic layer is polyimide or polyethylene terephthalate not containing fluorine.

Optionally, the display panel is an OLED display panel.

In a third aspect, the embodiments of the present application provide a display apparatus comprising: the display panel in the second aspect.

In a fourth aspect, the embodiments of the present application provide a method of preparing a pixel defining layer configured to define individual pixels on a substrate, using a defining solution, the method comprising:

mixing a first lyophobic material and a second lyophobic material into a lyophobic material, wherein a mass average molecular weight of the first lyophobic material is greater than a mass average molecular weight of the second lyophobic material;

mixing the lyophobic material, a lyophilic material, and an initiator into the defining solution, and coating the defining solution on the substrate, wherein a mass average molecular weight of the lyophilic material is greater than the mass average molecular weight of the first lyophobic material; and patterning the defining solution through a patterning process to form the pixel defining layer.

Optionally, a chain average fluorine content of the first lyophobic material is less than a chain average fluorine content of the second lyophobic material, and the lyophilic material does not contain fluorine.

Optionally, that patterning the defining solution through a patterning process to form the pixel defining layer comprising: forming the pixel defining layer by exposing, baking, and developing the defining solution.

Additional aspects of the present disclosure and advantages thereof are partially given in the following description, and these will become apparent from the following description, or be learned through practice of the present application.

BRIEF DESCRIPTION OF THE DRAWINGS

The above and/or additional aspects of the present application and advantages thereof will become apparent and readily appreciated from the following description of the embodiments, taken in conjunction with the accompanying drawings, in which.

DETAILED DESCRIPTION

Figure 1:
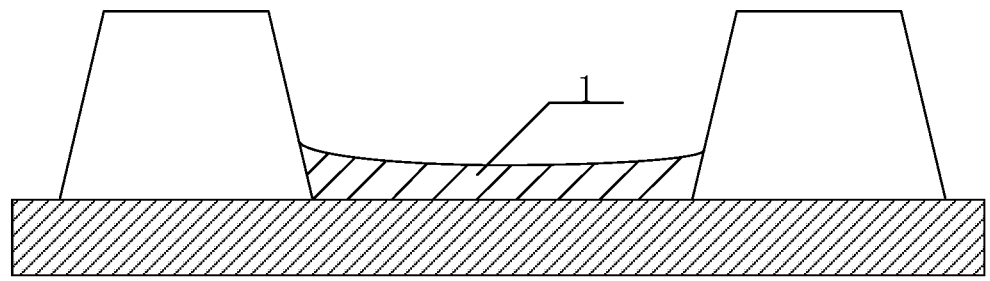
FIG. 1 is a schematic diagram showing a structure of a pixel defining layer with a single layer structure in the related art.

The present application is described in detail below and examples of the embodiments of the present application are illustrated in the accompanying drawings, wherein the same or similar reference numerals refer to the same or similar elements or elements having the same or similar functionality throughout the description. In addition, if a detailed description of the known art is unnecessary to the features of the present application shown, it is omitted. The embodiments described below with reference to the accompanying drawings are exemplary only for explaining the present application and are not construed as limiting the present application.

As can be appreciated by those skilled in the art, all terms (including technical and scientific terms) used herein have the same meanings as understood by one of ordinary skill in the art, unless otherwise specifically defined. It should also be understood that the terms defined in common dictionaries should be interpreted as having meanings consistent with their meanings in the context of the prior art, but should not be interpreted with idealized or extremely formalized meanings, unless otherwise expressly defined herein.

In the description of the present application, it is to be understood that the terms "center", "up", "down", "front", "rear", "left", "right", "vertical", "horizontal", "top", "bottom", "inner", "outer", and the like indicate orientation or position relations based on those shown in the drawings, merely for convenience in describing the present disclosure and simplifying the description, and do not indicate or imply that the apparatus or element must have a particular orientation or be constructed and operated in a particular orientation, and therefore, should not be construed as limiting the present disclosure.

The terms "first" and "second" are used for descriptive purposes only and are not to be construed as indicating or implying relative importance or to implicitly indicate the number of technical features indicated. Thus, a feature defined as "first" or "second" may explicitly or implicitly include one or more of that feature. In the description of the present disclosure, "a plurality" means two or more unless otherwise specified.

The following terms involved in this application will first be introduced and explained:

Inkjet printing: a nozzle sucks a probe reagent from a micropore plate and then moves the probe reagent to a processed holder, liquid droplets are sprayed to a surface of the holder by the power of a heat-sensitive or sound-controlled sprayer, to spray fine black or color ink droplets to the paper surface by means of inkjet.

Mass average molecular weight: a relative molecular mass obtained by averaging the number of molecules by mass, which is for example, a total mass of the polymer molecular chain divided by the number of polymer molecules.

Average chain fluorine content: a number of fluorine-containing atoms contained in each molecular chain of the fluorine-containing polymer.

The defining solution for preparing the pixel defining layer, the display panel, the display apparatus and the method of preparing the pixel defining layer provided in the present application aim to solve the technical problems in the prior art that, the pixel defining layer with a single-layer structure easily causes uneven luminescence within the device pixel, thereby influencing the service life of the device, and that the use of two sets of mask plates is needed in the process of fabricating the pixel defining layer with a double-layer structure, which is complicated in technology and high in cost.

The following describes the technical solution of the present application and how to solve the above technical problems in detail by specific embodiments.

The embodiments of the present disclosure discloses a defining solution for preparing a pixel defining layer comprising: a lyophilic material, lyophobic material, and an initiator, wherein the lyophobic material comprises: a first lyophobic material and a second lyophobic material, and wherein a mass average molecular weight of the first lyophobic material is greater than a mass average molecular weight of the second lyophobic material, and a mass average molecular weight of the lyophilic material is greater than the mass average molecular weight of the first lyophobic material.

Optionally, a chain average fluorine content of the first lyophobic material is less than a chain average fluorine content of the second lyophobic material, and the lyophilic material does not contain fluorine.

It should be noted that, the chain average fluorine content of the first lyophobic material and the second lyophobic material is closely related to their lyophilic property and lyophobic property, and in order to ensure that the first lyophobic material and the second lyophobic material can be mutually soluble, the chain average fluorine content of the first lyophobic material may be 30% to 80% of the chain average fluorine content of the second lyophobic material, and a specific content ratio may be set according to actual application conditions, which are not listed one by one herein.

Optionally, a mass ratio of the first lyophobic material is 2%-20% of the defining solution, a mass ratio of the second lyophobic material is 20%-50% of the defining solution, and a mass ratio of the lyophilic material is 30%-76% of the defining solution. However, those skilled in the art could also select a suitable mass ratio according to actual needs.

With the use of the pixel defining layer prepared by the defining solution in the embodiments of the present application, since the defining solution comprises a first lyophobic material and a second lyophobic material, the prepared pixel defining layer can comprise two lyophobic layers, and as compared with the pixel defining layer with a single-layer structure in prior art, the lyophobic layer of the pixel defining layer prepared in the embodiments of the present application is thicker, which can better avoid, in the inkjet printing process, the ink droplets from climbing along the lyophilic layer to the lyophobic layer in the drying process, such that the film layer fabricated by inkjet printing is flatter, and the formation of an uneven film layer thick on edges and thin in the middle is avoided.

Figure 2:
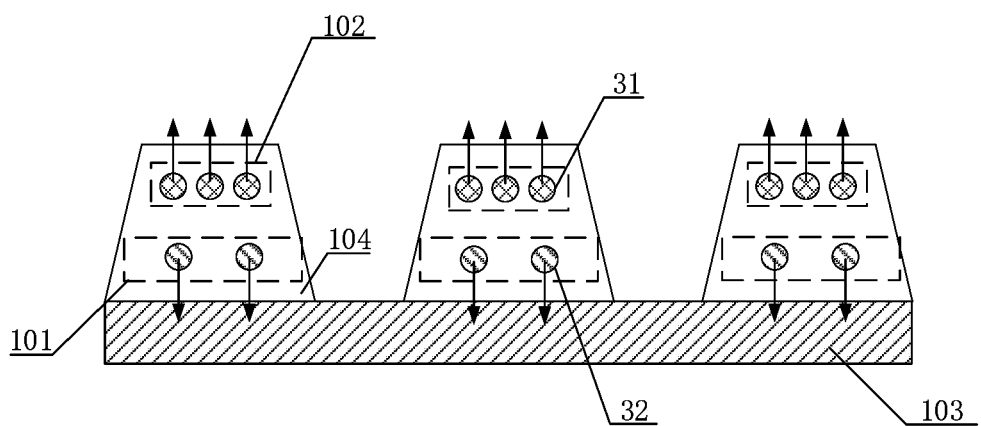
FIG. 2 is a schematic diagram showing a specific structure of a pixel defining layer according to some embodiments of the present application.

Based on the same inventive concept, the embodiments of the present disclosure further disclose a display panel, as shown in FIG. 2, comprising a substrate 103, and a pixel defining layer located on one side of the substrate 103, wherein the pixel defining layer comprises: a first lyophilic layer 104, a first lyophobic layer 101, and a second lyophobic layer 102, the first lyophobic layer 101 is located on a side close to the substrate 103, the second lyophobic layer 102 is located on a side away from the substrate 103, a mass average molecular weight of the first lyophobic layer 101 is greater than a mass average molecular weight of the second lyophobic layer 102, and a mass average molecular weight of the first lyophilic layer 104 is greater than the mass average molecular weight of the first lyophobic layer 101.

Optionally, a chain average fluorine content of the first lyophobic layer 101 is less than a chain average fluorine content of the second lyophobic layer 102, and the first hydrophilic layer 104 does not contain fluorine.

It should be noted that, in the display panel in the embodiments of the present application, a specific arrangement of the first hydrophilic layer 104 is similar to that in the prior art, and is not described herein again; the first lyophobic layer 101 is located on a side close to the substrate 103, the second lyophobic layer 102 is located aside away from the substrate 103, and the first lyophobic layer 101 and the second lyophobic layer 102 collectively constitute the lyophobic layer of the pixel defining layer; as compared with the pixel defining layer with a single-layer structure in prior art, the lyophobic layer comprised in the pixel defining layer in the embodiments of the present application is thicker, which can better avoid, in the inkjet printing process, the ink droplets from climbing along the lyophilic layer to the lyophobic layer in the drying process, such that the film layer fabricated by inkjet printing is flatter, the formation of an uneven film layer thick on edges and thin in the middle is avoided, and the effect of inkjet printing is improved. In addition, the first hydrophilic layer 104 is arranged such that a portion of the pixel defining layer close to the substrate 103 is lyophilic, ensuring sufficient spreading of the ink droplets in a defined area in the inkjet printing process.

Optionally, in this embodiment, a thickness of the pixel defining layer is 1.0 to 1.5 micrometers. However, those skilled in the art could also set pixel defining layers with other suitable thicknesses.

It should be noted that the pixel defining layer can be formed by a spin coating or slit coating process, and the thickness of the pixel defining layer is between 1.0 and 1.5 micrometers, which can ensure that the ink droplets formed in the inkjet printing process are limited in a designated area and will not flow to other pixel areas or non-pixel areas.

Optionally, a chain average fluorine content of the first lyophobic layer 101 is 30% to 80% of a chain average fluorine content of the second lyophobic layer 102; amass ratio of the first lyophobic layer 101 to the second lyophobic layer 102 is 10% to 40%. Specifically, the pixel defining layer in the embodiment of the present disclosure is formed by the above-mentioned defining solution, and a specific fabricating method will be described in the following.

Optionally, the first lyophobic layer 101 comprises hydroxyl functional groups. It should be noted that the first lyophobic layer 101 is modified by the hydroxyl functional groups, so that the affinity between the pixel defining layer and the ink droplets is improved, and the probability of dewetting the ink droplets is reduced.

Optionally, a material of the first lyophobic layer 101 is polyimide or polyethylene terephthalate containing fluorine, a material of the second lyophobic layer 102 is polyimide or polyethylene terephthalate containing fluorine, and a material of the first hydrophilic layer 104 is polyimide or polyethylene terephthalate not containing fluorine.

Figure 3:
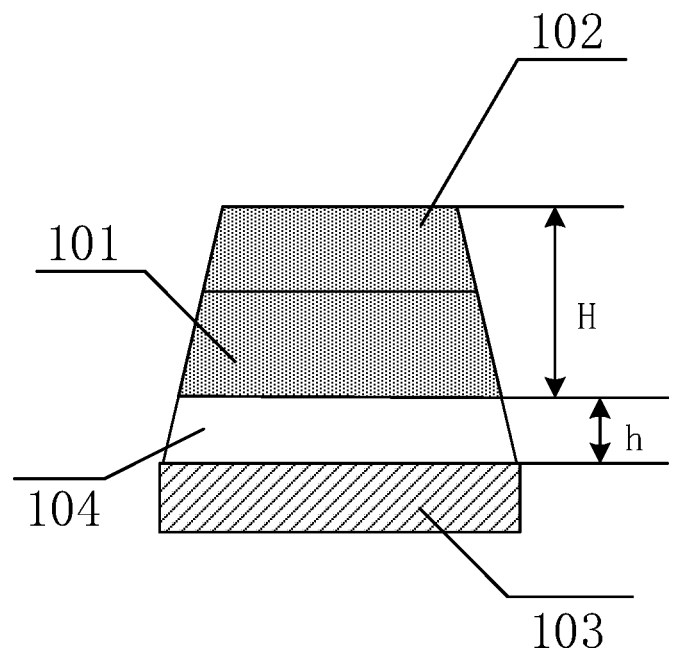
FIG. 3 is a schematic diagram showing a structure of a pixel defining layer according to some embodiments of the present application.

In some optional embodiments, as shown in FIG. 3, the first lyophobic layer 101 is in direct contact with the second lyophobic layer 102; such an arrangement makes a lower region (a height region shown as h) of the pixel defining layer lyophilic, and an upper region thereof (a height region shown as H) lyophobic, for example: the thickness of the pixel defining layer is 1.0 micrometer, then the value of h can be 100 nanometers to 200 nanometers, and the value of H can be 900 nanometers to 800 nanometers in the embodiment of the present application, so that the pixel defining layer in the embodiment of the present application can well avoid, in the inkjet printing process, the ink droplets from climbing along the lyophilic layer to the lyophobic layer in the drying process; in a specific implementation, if the material is selected, specific values of h and H can be adjusted according to the temperature in the fabrication process, e.g., according to the temperature during baking and baking time period.

Figure 4:
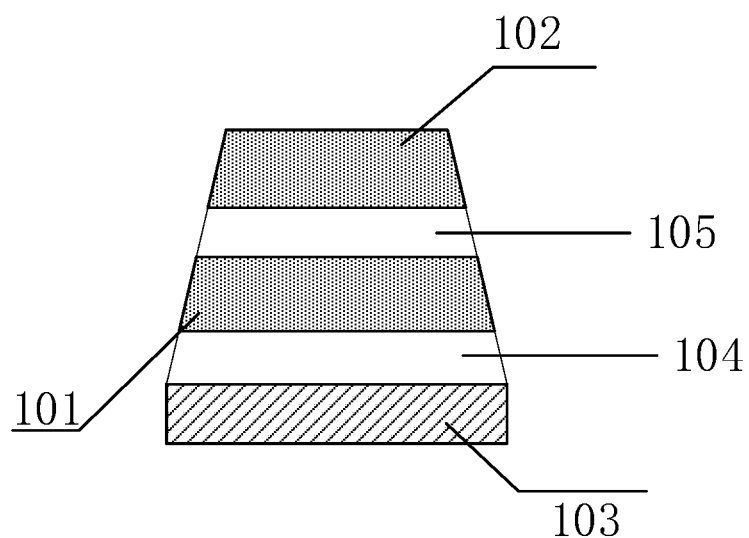
FIG. 4 is a schematic diagram showing a structure of another pixel defining layer according to some embodiments of the present application.

In some other optional embodiments, as shown in FIG. 4, a second hydrophilic layer 105 is provided between the first lyophobic layer 101 and the second lyophobic layer 102, that is, the first lyophobic layer 101 is not indirect contact with the second lyophobic layer 102, the second hydrophilic layer 105 is disposed between the first lyophobic layer 101 and the second lyophobic layer 102, and a mass average molecular weight of the second hydrophilic layer 105 is greater than a mass average molecular weight of the second lyophobic layer 102 and less than the mass average molecular weight of the first lyophobic layer 101; as compared with the embodiment shown in FIG. 3, although the lyophobic layer on the top of the pixel defining layer is thinner, when the ink droplets printed by inkjet climb along the hydrophilic layer 104 from the bottom in the drying process, due to the existence of the first lyophobic layer 101, climbing of the ink droplets will be interrupted, thereby reducing the climbing height of the ink droplets in the whole drying process, which can effectively avoid the formation of an uneven film layer, improve the inkjet printing effect, and prolong the service life of the device.

Optionally, a material of second hydrophilic layer 105 is polyimide or polyethylene terephthalate not containing fluorine.

Based on the same inventive concept, the embodiments of the present application further provide a display apparatus comprising: the display panel provided in the above embodiments. In the present disclosure, the display apparatus may be a display panel, a television set, a mobile phone, or the like. The implementation principle of the display apparatus is the same as that of the display panel provided in the above embodiments, and is not described herein again.

Figure 5:
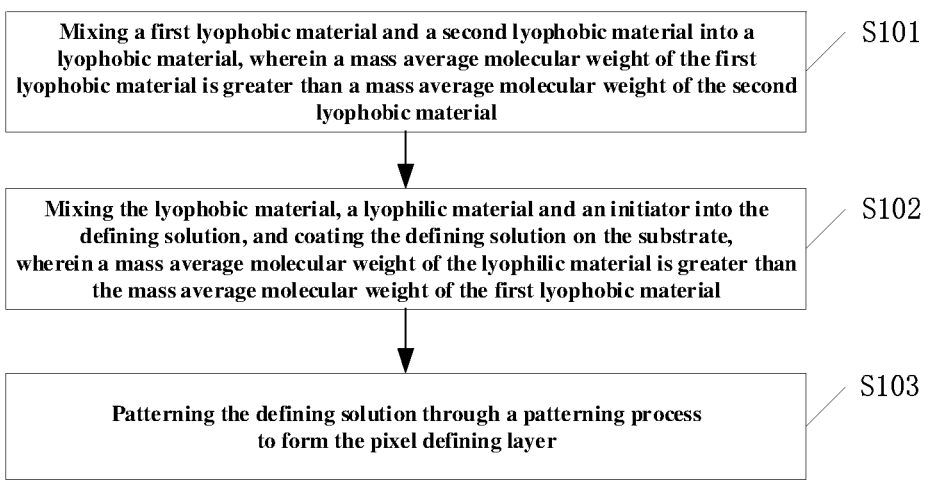
FIG. 5 is a flowchart showing a method of preparing a pixel defining layer using a defining solution according to some embodiments of the present application.

Based on the same inventive concept, the embodiments of the present application further provide a method of fabricating a pixel defining layer, as shown in FIG. 5, comprising:

S101, mixing a first lyophobic material and a second lyophobic material into a lyophobic material, wherein a mass average molecular weight of the first lyophobic material is greater than a mass average molecular weight of the second lyophobic material.

S102, mixing the lyophobic material, a lyophilic material and an initiator into a defining solution, and coating the defining solution on a substrate, wherein a mass average molecular weight of the lyophilic material is greater than the mass average molecular weight of the first lyophobic material.

S103, patterning the defining solution through a patterning process to form the pixel defining layer.

With the use of the method of fabricating the pixel defining layer provided by the embodiments of the present application, since the mass average molecular weight of the first lyophobic material is greater than the mass average molecular weight of the second lyophobic material, under the action of gravity, the first lyophobic material with a great mass average molecular weight is located on a side close to the substrate and the second lyophobic material with a small mass average molecular weight is located on a side far away from the substrate, and then the defining solution is pattered through a patterning process to form the pixel defining layer. Since the pixel defining layer fabricated by the embodiments of the present application comprises the first lyophobic layer and the second lyophobic layer, as compared with the method of fabricating a pixel defining layer with a single-layer structure in the prior art, the lyophobic layer comprised in the pixel defining layer in the embodiments of the present application is thicker, which can better avoid, in the inkjet printing process, the ink droplets from climbing along the lyophilic layer to the lyophobic layer in the drying process, and can improve uniformity of luminescence within the device pixel, thereby prolonging the service life of the device; in addition, as compared with the method of fabricating a pixel defining layer with a double-layer structure in the prior art, the use of two sets of mask plates is eliminated, the fabrication process is simple, and the cost is low.

Specifically, in S101, the first lyophobic material and the second lyophobic material are fully mixed according to a preset ratio to form the lyophobic material, and the first lyophobic material and the second lyophobic material are mutually soluble similar or dissimilar materials, for example, the first lyophobic material and the second lyophobic material both are polyimide containing fluorine, or the first lyophobic material and the second lyophobic material both are polyethylene terephthalate containing fluorine.

Specifically, the internal chemical structures of the first lyophobic material and the second lyophobic material both contain fluorine chains, and the materials modified by fluorine show corresponding lyophobic properties. In the embodiment of the present application, the mass average molecular weight of the first lyophobic material is greater than that of the second lyophobic material, and the chain average fluorine content of the first lyophobic material is less than that of the second lyophobic material, so that the first lyophobic material is located on a side close to the substrate and the second lyophobic material is located on a side far away from the substrate under the action of gravity.

Specifically, in S102, the defining solution formed by mixing the lyophobic material, the lyophilic material, and the initiator is coated on the substrate by a spin coating or slit coating process.

Optionally, the chain average fluorine content of the first lyophobic material is less than the chain average fluorine content of the second lyophobic material.

It should be noted that lyophilic or lyophobic property of a material is related to its inner chain average fluorine content; the second lyophobic material has a great chain average fluorine content, has a low surface energy, and shows a strong lyophobic property; the first lyophobic material has a small chain average fluorine content, has a high surface energy, and has a lyophobic property less than that of the second lyophobic material.

Optionally, that patterning the defining solution through a patterning process to form a pixel defining layer, comprising: forming the pixel defining layer by exposing, baking, and developing the defining solution.

It should be noted that, proper exposure amount, exposure time period, baking temperature, and baking time period are selected according to the chain average fluorine contents of the first lyophobic material and the second lyophobic material, so that fluorine in the first lyophobic material and the second lyophobic material is respectively moved to an interface of the corresponding lyophobic layer far away from the substrate, to simply and quickly forma pixel defining layer with high-performance double lyophobic layers, which solves the problems of complex fabrication process and high cost of the existing double-layer structure.

More specifically, the amount of energy used for exposure and baking can be determined according to the chain average fluorine content of the first lyophobic material and the second lyophobic material. For example, in case where the chain average fluorine contents of both the first lyophobic material and the second lyophobic material are high, the exposure and baking may be performed with a low energy; in contrast, in case where the chain average fluorine contents of both the first lyophobic material and the second lyophobic material are low, the exposure and baking can be performed with a high energy. For another example, in case where one of the first lyophobic material and the second lyophobic material has a high chain average fluorine content and the other has a low chain average fluorine content, an appropriate energy for exposure and baking may be determined based on the averaged chain average fluorine content.

The pixel defining layer according to the embodiments of the present application is described in detail below with reference to a specific embodiment.

As shown in FIG. 2, in the embodiment of the present application, an organic resin A (a first lyophobic material) and an organic resin B (a second lyophobic material) with good mutual solubility are mixed to form a lyophobic material, then the lyophobic material, a lyophilic material, and an initiator are mixed to form a defining solution, the defining solution is coated on a substrate through a spin coating or slit coating process, and finally, a pixel defining layer with a thickness of 1.0 to 1.5 micrometers is formed through a patterning process; wherein amass average molecular weight of the organic resin A is greater than that of the organic resin B, and a chain average fluorine content of the organic resin A is 30-80% of that of the organic resin B.

As shown in FIG. 2, a molecular main chain 32 of the organic resin A is automatically deposited downward (i.e., a side close to the substrate 103) due to gravity, a molecular main chain 31 of the organic resin B floats upward (i.e., a side away from the substrate 103); since the fluorine content of the organic resin B is higher than that of the organic resin A, the fluorine content at the top of the pixel defining layer is high, the surface energy is low, so that ink droplets for inkjet printing can be precisely confined within subpixels, and will not flow to other subpixel regions or non-pixel regions, and due to the existence of the organic resin A, as compared with the prior art, as the ink droplets for inkjet printing climb along the hydrophilic layer 104 from the bottom in the drying process, due to the existence of the first lyophobic layer 101, the climbing of the ink droplets is interrupted, thereby the climbing height of the ink droplets is reduced in the whole drying process, making the film layer flatter; meanwhile, due to the arrangement of the bottom hydrophilic layer 104, the pinhole leakage phenomenon caused by incomplete spreading of the ink droplets in the subpixel region in the inkjet printing process can be avoided.

To sum up, the pixel defining layer provided by the embodiments of the present application comprises the first hydrophilic layer 104, the first lyophobic layer 101, and the second lyophobic layer 102, the first lyophobic layer 101 is located on a side close to the substrate 103, and the second lyophobic layer 102 is located on a side away from the substrate 103; as compared with the pixel defining layer with a single-layer structure in prior art, the lyophobic layer comprised in the pixel defining layer in the embodiments of the present application is thicker, which can better avoid, in the inkjet printing process, the ink droplets from climbing along the lyophilic layer to the lyophobic layer in the drying process, such that the film layer fabricated by inkjet printing is flatter, the formation of an uneven film layer thick on edges and thin in the middle is avoided, and the effect of inkjet printing is improved. In addition, as compared with the pixel defining layer with a double-layer structure in the prior art, the fabrication process is simple and the cost is low.

It should be understood that, although the steps in the flowchart of the drawings are shown in order as indicated by the arrows, the steps are not necessarily performed in order as indicated by the arrows. The steps are not performed in the exact order shown and may be performed in other orders unless otherwise indicated herein. Moreover, at least a portion of the steps in the flowchart of the drawings may include multiple sub-steps or multiple stages, which are not necessarily performed at the same time, but may be performed at different times, and the order of execution thereof is not necessarily sequential, but may be performed alternately with other steps or at least a portion of the sub-steps or stages of other steps.

The foregoing is only a few embodiments of the present application and it should be noted that those skilled in the art can make various improvements and modifications without departing from the principle of the present application, and that these improvements and modifications should also be considered as the protection scope of the present application.

What is claimed is:

1. A defining solution for preparing a pixel defining layer configured to define individual pixels on a substrate, comprising: a lyophilic material, a lyophobic material and an initiator, wherein the lyophobic material comprises: a first lyophobic material and a second lyophobic material, and wherein a mass average molecular weight of the first lyophobic material is greater than a mass average molecular weight of the second lyophobic material, and a mass average molecular weight of the lyophilic material is greater than the mass average molecular weight of the first lyophobic material, wherein the chain average flourine content of the first lyophobic material is 30% to 80% of the chain average fluorine content of the second lyophobic material.

2. The defining solution according to claim 1, wherein a mass ratio of the first lyophobic material is 2%-20% of the defining solution, a mass ratio of the second lyophobic material is 20%-50% of the defining solution, and a mass ratio of the lyophilic material is 30%-76% of the defining solution.

3. A display panel, comprising a substrate, and a pixel defining layer located on one side of the substrate and configured to define individual pixels on the substrate, wherein the pixel defining layer comprises: a first hydrophilic layer, a first lyophobic layer, and a second lyophobic layer;
   a first lyophilic layer is located on the one side of the substrate;
   the first lyophobic layer is located on one side of the first hydrophilic layer away from the substrate; and
   the second lyophobic layer is located on one side of the first lyophobic layer away from the substrate,
   wherein a mass average molecular weight of the first lyophobic layer is greater than a mass average molecular weight of the second lyophobic layer, and a mass average molecular weight of the first hydrophilic layer is greater than the mass average molecular weight of the first lyophobic layer, and wherein the chain average flourine content of the first lyophobic layer is 30% to 80% of the chain average fluorine content of the second lyophobic layer.

4. The display panel according to claim 3, wherein the first lyophobic layer is in direct contact with the second lyophobic layer.

5. The display panel according to claim 3, further comprising: a second lyophilic layer disposed between the first lyophobic layer and the second lyophobic layer, wherein a mass average molecular weight of the second lyophilic layer is greater than the mass average molecular weight of the second lyophobic layer and less than the mass average molecular weight of the first lyophobic layer.

6. The display panel according to claim 3, wherein a mass ratio of the first lyophobic layer to the second lyophobic layer is 10% to 40%.

7. The display panel according to claim 3, wherein the first lyophobic layer comprises hydroxyl functional groups.

8. The display panel according to claim 3, wherein a material of the first lyophobic layer is polyimide or polyethylene terephthalate containing fluorine, a material of the second lyophobic layer is polyimide or polyethylene terephthalate containing fluorine, and a material of the first lyophilic layer is polyimide or polyethylene terephthalate not containing fluorine.

9. The display panel according to claim 5, wherein a material of the first lyophobic layer is polyimide or polyethylene terephthalate containing fluorine, a material of the second lyophobic layer is polyimide or polyethylene terephthalate containing fluorine, a material of the first lyophilic layer is polyimide or polyethylene terephthalate not containing fluorine, and a material of the second lyophilic layer is polyimide or polyethylene terephthalate not containing fluorine.

10. The display panel according to claim 3, wherein the display panel is an OLED display panel.

11. A display apparatus comprising, a display panel which comprises a substrate, and a pixel defining layer located on one side of the substrate and configured to define individual pixels on the substrate, wherein the pixel defining layer comprises: a first hydrophilic layer, a first lyophobic layer, and a second lyophobic layer;
a first lyophilic layer is located on the one side of the substrate;
the first lyophobic layer is located on one side of the first lyophobic layer away from the substrate; and
the second lyophobic layer is located on one side of the first lyophobic layer away from the substrate;
wherein a mass average molecular weight of the first lyophobic layer is greater than a mass average molecular weight of the second lyophobic layer, and a mass average molecular weight of the first hydrophilic layer is greater than the mass average molecular weight of the first lyophobic layer, and wherein the chain average fluorine content of the first lyophobic layer is 30% to 80% of the chain average fluorine content of the second lyophobic layer.

12. The display apparatus according to claim 11, wherein the first lyophobic layer is in direct contact with the second lyophobic layer.

13. The display apparatus according to claim 11, wherein the display panel further comprises: a second lyophilic layer disposed between the first lyophobic layer and the second lyophobic layer, and wherein a mass average molecular weight of the second lyophilic layer is greater than the mass average molecular weight of the second lyophobic layer and less than the mass average molecular weight of the first lyophobic layer.

14. The display panel according to claim 3, wherein the pixel defining layer is prepared by a method comprising steps of:
mixing a first lyophobic material and a second lyophobic material into a lyophobic material, wherein a mass average molecular weight of the first lyophobic material is greater than a mass average molecular weight of the second lyophobic material, such that under the action of gravity, the first lyophobic material is located on a side close to the substrate, and the second lyophobic material is located on a side far away from the substrate;
mixing the lyophobic material, a lyophilic material, and an initiator into the defining solution, and coating the defining solution on the substrate, wherein a mass average molecular weight of the lyophilic material is greater than the mass average molecular weight of the first lyophobic material; and
patterning the defining solution through a patterning process to form the pixel defining layer.

* * * * *

UNITED STATES PATENT AND TRADEMARK OFFICE
CERTIFICATE OF CORRECTION

PATENT NO. : 11,690,267 B2
APPLICATION NO. : 17/251837
DATED : June 27, 2023
INVENTOR(S) : Wenbin Jia Page 1 of 1

It is certified that error appears in the above-identified patent and that said Letters Patent is hereby corrected as shown below:

In the Claims

Column 10, Line 38, Claim 1, delete "flourine" and insert -- fluorine --

Column 10, Line 65, Claim 3, delete "flourine" and insert -- fluorine --

Column 11, Line 43, Claim 11, delete "lyophobic" and insert -- hydrophilic --

Signed and Sealed this
Fifteenth Day of August, 2023

Katherine Kelly Vidal
*Director of the United States Patent and Trademark Office*